United States Patent
Wang et al.

[11] Patent Number: 6,127,278
[45] Date of Patent: *Oct. 3, 2000

[54] ETCH PROCESS FOR FORMING HIGH ASPECT RATIO TRENCHED IN SILICON

[75] Inventors: Yiqiong Wang, Morgan Hill; Maocheng Li, Fremont; Shaoher Pan, San Jose, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/985,771

[22] Filed: Dec. 5, 1997

Related U.S. Application Data

[63] Continuation-in-part of application No. 08/867,229, Jun. 2, 1997.

[51] Int. Cl.[7] .................................................. H01L 21/00
[52] U.S. Cl. ........................... 438/719; 216/67; 252/79.1; 438/714; 438/734; 438/694
[58] Field of Search ...................... 216/67, 79; 252/79.1; 438/710, 713, 714, 719, 720, 734, 735, 742, 694, 696

[56] References Cited

U.S. PATENT DOCUMENTS

| | | | |
|---|---|---|---|
| 4,490,209 | 12/1984 | Hartman | 252/79.1 X |
| 4,617,086 | 10/1986 | Chuang et al. | 156/643 |
| 4,726,879 | 2/1988 | Bondur et al. | 156/643 |
| 4,729,815 | 3/1988 | Leung | 156/643 |
| 5,013,398 | 5/1991 | Long et al. | 156/643 |
| 5,110,411 | 5/1992 | Long | 156/656 |
| 5,160,408 | 11/1992 | Long | 156/656 |
| 5,200,028 | 4/1993 | Tatsumi | 156/656 |
| 5,211,790 | 5/1993 | Tatsumi | 156/662 |
| 5,262,002 | 11/1993 | Grewal et al. | 156/657 |
| 5,449,433 | 9/1995 | Donohoe | 156/643.1 |
| 5,453,156 | 9/1995 | Cher et al. | 156/643.1 |
| 5,458,734 | 10/1995 | Tsukamoto | 156/643.1 |
| 5,498,312 | 3/1996 | Laermer et al. | 156/643.1 |
| 5,522,966 | 6/1996 | Komura et al. | 156/662.1 |
| 5,536,364 | 7/1996 | Yoshida et al. | 156/643.1 |
| 5,545,290 | 8/1996 | Douglas | 156/646.1 |
| 5,605,603 | 2/1997 | Grimard et al. | 438/719 X |
| 5,871,659 | 2/1999 | Sakano et al. | 438/719 X |
| 5,874,362 | 2/1999 | Wong et al. | 438/719 |

*Primary Examiner*—William Powell
*Attorney, Agent, or Firm*—Birgit Morris

[57] ABSTRACT

A multistep etch process for forming high aspect ratio trenches in silicon having a silicon oxide and/or silicon nitride hardmask. In a first step, an etch composition of HBr and oxygen is used, depositing a passivation layer on the sidewalls and producing slightly tapered openings. In the second step, an etch composition of a fluorine-containing gas such as $SF_6$, HBr and oxygen is used, producing more vertical openings at a high etch rate. The taper of the openings during the second step can be controlled by adjusting the relative amount of HBr or $SF_6$ employed. This process is a clean process that does not require cleaning of the etch chamber between etch steps.

23 Claims, 11 Drawing Sheets

ETCH PROCESS FOR FORMING HIGH ASPECT RATIO TRENCHED IN SILICON

This invention is a continuation-in-part of Ser. No. 08/867,229 filed Jun. 2, 1997.

This invention relates to a new etch process for etching high aspect ratio openings in silicon. More particularly, this invention relates to a new etch process for etching very small diameter openings in silicon, i.e., a diameter less than 0.25 micron.

BACKGROUND OF THE DISCLOSURE

As devices for the semiconductor industry have become smaller and more closely packed together, processes to make such devices must be developed. In order to make devices such as DRAMS, high aspect ratio, straight walled trenches need to be made in silicon which are then filled with one or more dielectric layers to form capacitors. The trenches must be completely filled without voids.

In order to make 256 MB devices, openings in silicon must be etched that have a diameter on the order of 0.25–0.3 micron that are at least 8 microns deep. Conventional etchant compositions such as HBr and oxygen can form such devices, but there are limitations in the use of this etchant composition. As etching continues, the etch rate decreases. Further, while this etchant composition deposits a passivation layer on the sidewalls of the trench, the passivation layer also deposits on the top of the substrate, and on the process chamber walls and fixtures. As conditions such as temperature in the chamber change, these deposits flake off, forming particles in the chamber. Since particles are highly undesirable because they can fall onto the substrates being processed in the chamber, the chamber must be cleaned often, generally after each substrate is processed. The need for such frequent cleaning reduces the throughput of single substrate processing, and adds to the cost of making these semiconductor devices.

Various halogen-containing etchants for silicon-containing materials are known, but all of them have various characteristics that make them inadequate as etchants for making small diameter, deep openings having straight walls in silicon. Some etchants etch isotropically rather than anisotropically; some etchants deposit polymer-containing materials on the sidewalls of the trench, preventing smooth filling of the trench; some produce bowed or shaped sidewalls that cannot be filled properly; some of them have low etch rates; and some of them require high chamber power that causes damage to or contamination of the substrate. Microloading is also a problem. Various combinations of etchants have also been tried, but all of them are inadequate in terms of obtaining etchants that are highly selective with respect to a patterned mask, that will etch high aspect ratio, straight walled openings that have rounded bottoms in silicon, and that will etch silicon-containing material at high etch rates with minimal microloading.

A conventional etchant composition for silicon comprises hydrogen bromide (HBr) and oxygen ($O_2$). This etchant composition produces a passivation layer on the trench sidewalls, and thus forms somewhat tapered trenches. The addition of a small amount of a fluorine-containing gas removes the passivation layer from the bottom of the etched trench, permitting a deeper trench to be formed. However, the passivation material deposits onto the etch chamber and its parts as well, leading to particle contamination of the wafers and a requirement that the chamber must be frequently cleaned, generally between every wafer. Further, using this etchant composition, there is a comparatively low selectivity between the silicon to be etched and the silicon oxide hardmasks generally used, which leads to severe hardmask erosion during the etch. This etch process also requires a high density plasma and high power transmission to the chamber.

In prior application Ser. No. 08/867,229 filed Jun. 2, 1997, of which this application is a continuation-in-part, an improved etchant composition for silicon was discovered, comprising a fluorine-containing gas, such as silicon hexafluoride ($SF_6$), HBr and $O_2$.

This etch composition will etch silicon-containing materials, particularly polysilicon or crystalline silicon, at high etch rates of 0.8 to 3 microns per minute. This etchant composition is also anisotropic, and will produce high aspect ratio, straight walled openings in silicon that have rounded bottoms.

However, this etchant composition is not completely satisfactory when high aspect ratio openings in silicon are to be made.

Figure 1:
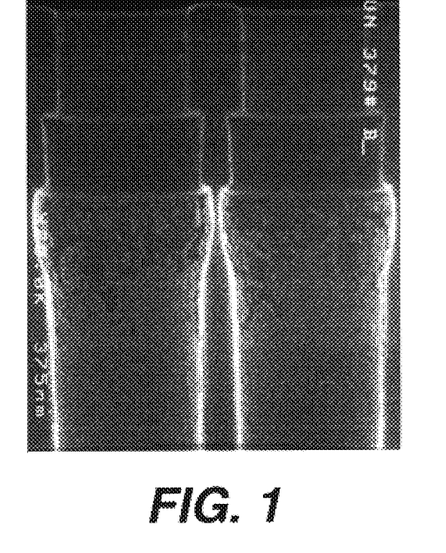
FIG. 1 is a photograph an opening made in silicon using a two layer hardmask.

Further, this etchant is not completely satisfactory when a bi-layer hardmask comprising silicon oxide over silicon nitride is used. FIG. 1A illustrates the problem. Using an etchant composition of HBr, $O_2$ and $SF_6$, it is apparent that the silicon nitride part of the mask erodes during the etch, enlarging the diameter of the silicon nitride etched opening, and forming a step at the interface between the silicon oxide layer and the silicon nitride layer.

Still further, in order to properly fill very small diameter openings in silicon, the openings desirably are shaped so they are at least as wide at the bottom of the opening as at the top of the opening, while still maintaining a rounded bottom. Further, the opening desirably is substantially perpendicular with respect to the surface of the substrate.

Thus an etch process was sought that would provide smoothly tapered openings through one or more hardmask layers, would provide straight walled openings perpendicular to the silicon substrate surface, would be able to etch very small, e.g., less than 0.25 micron diameter openings in silicon having a high aspect ratio, that can provide variable sidewall taper and provide a clean process that avoids the need to clean the etch chamber between each substrate to be processed.

SUMMARY OF THE INVENTION

We have found that a sequential multistep etch, using in a first etch step an etchant composition of HBr and $O_2$, followed by a second etch step using as the etch a composition of a fluorine-containing gas, HBr and $O_2$, forms small diameter, deep, straight walled openings in silicon at high etch rates.

The first etch step provides passivation of the sidewalls, protecting the hardmask and maintaining the desired, somewhat tapered, shape of the top of the openings, while the second step provides an anisotropic etch at high etch rates. The passivation material is removed from the sidewalls, the substrate and the chamber during the second etch step, producing a clean method that avoids the need for cleaning the etch chamber between each processed wafer and improving throughput.

DETAILED DESCRIPTION OF THE INVENTION

Figure 2:
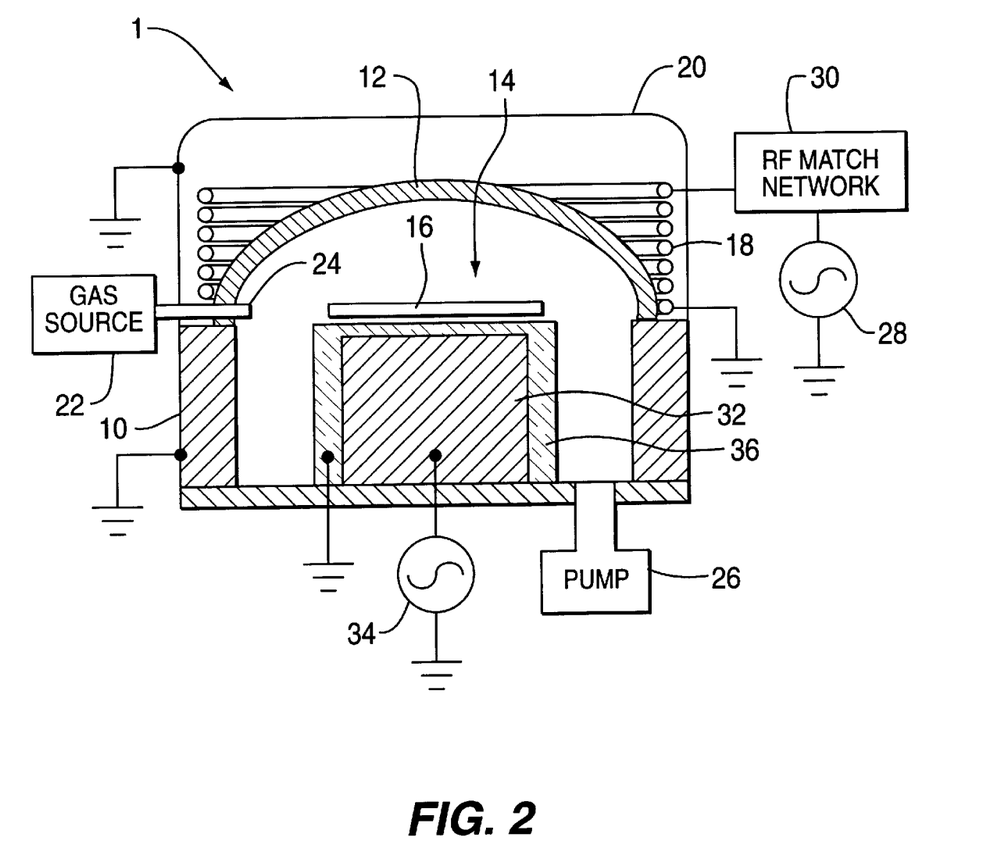
FIG. 2 is a schematic cross sectional view of a plasma reactor in which the present etch of silicon-containing material can be carried out.

The present etch process can suitably be carried out in a plasma reactor such as is shown in FIG. 2. This chamber is known as a decoupled plasma source chamber. Referring to FIG. 2, an inductively coupled RF plasma reactor includes a reactor chamber 1 having a grounded, conductive, cylindrical sidewall 10 and a shaped dielectric ceiling 12, e.g., dome-like. The reactor 1 includes a wafer pedestal 14 for supporting a semiconductor wafer 16 in the center of the chamber 1. A cylindrical inductor coil 18 surrounds an upper portion of the chamber, beginning near the plane of the top of the wafer or wafer pedestal 14, and extending upwardly therefrom toward the top of the chamber.

A processing gas source 22 and a gas inlet 24, which can be a plurality of inlets spaced about the chamber, furnishes a processing gas into the interior of the chamber; and a pump 26 controls the chamber pressure.

The inductor coil 18 is energized by a plasma source power supply or RF generator 28 through a conventional active RF match network 30, the top winding of the coil inductor 18 being "hot" and the bottom winding being grounded. The wafer pedestal 14 includes an interior conductive portion 32 connected to a bias RF power supply or generator 34 and an exterior grounded conductor 36 (insulated from the interior conductive portion 32). A conductive grounded RF shield 20 surrounds the coil inductor 18.

In accordance with one aspect of the chamber 1, uniformity of the plasma density spatial distribution across the wafer is improved by shaping the ceiling 12 of the chamber 1 as a multi-radius dome, and individually determining or adjusting each one of the multiple radii of the ceiling 12. The multiple-radius dome shape shown in the embodiment of FIG. 2 somewhat flattens the curvature of the dome ceiling 12 around the center portion of the dome, the peripheral portion of the dome 12 having a steeper curvature.

During processing, processing gas is passed into the chamber 1, and the power sources are turned on, forming a high density plasma in the chamber 1. The power to the chamber 1 from the inductive coil RF power source 28 is suitably up to about 3000 watts. The RF source to the coil suitably can be a 12.56 MHz power source. The bias power to the substrate support 14 can vary up to 1000 watts, which provides a good etch rate. The bias frequency can vary from about 400 kHz up to about 13.56 MHz, but is preferably about 400 kHz. This provides improved profile control. However, the above frequencies are given for purposes of illustration only and different frequencies can be used. Frequencies as low as 50 kHz and as high as 13.56 MHz, and multiples thereof, can also be employed.

Figure 3:
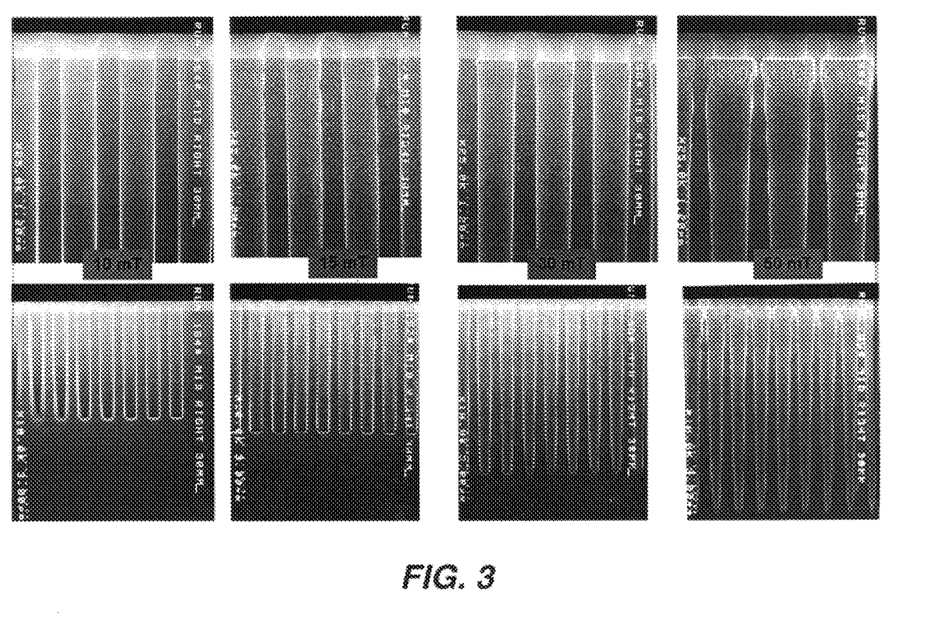
FIG. 3 presents photographs of etched trenches using a second step etchant of $SF_6$, HBr and $O_2$ while varying the pressure in the chamber.

During etching, the pressure is important; generally the etch rate increases with pressure, but it reaches a maximum and the etch rate then decreases at pressures above that maximum level. If the pressure is too high, the etch becomes more isotropic. The first etch step can be carried out at pressures between about 10 and 150 millitorr. The second etch step can be carried out at pressures between about 1 and 100 millitorr, but preferably a pressure of about 10–60 millitorr is employed. FIG. 3 illustrates openings made by varying the pressure during the second etch step. As the pressure is increased, the etch rate also increases.

Using a plasma reactor as described above, the power to the chamber from the inductive coil power source during the first etch step can be from about 500 to 3000 watts. During the second etch step, the power is suitably about 400 to about 1600 watts. The bias power to the substrate support can vary from about 5 to 300 watts, which provides a good etch rate. During the first etch step the power applied to both the coil and the substrate support is generally higher than during the second etch step. One of the advantages of the described chamber is that it provides independent control of the energy supplied to the chamber and to the substrate support.

The etchant composition ingredients are passed into the chamber generally using gas flow rates of from about 10 sccm to 300 sccm of HBr and from about 1 sccm to 30 sccm of oxygen. Preferably the oxygen is added as a mixture of helium and oxygen, such as helium containing about 30% by volume of oxygen, in an amount of about 10 to 25 volume percent of the HBr added. This mixture is referred to hereinafter as $HeO_2$. The addition of helium dilutes the oxygen and makes it easier to control the flow of oxygen to the chamber. A preliminary short etch, about 10 to 20 seconds in duration, with HBr alone, can be used to remove any native oxide on the surface of the silicon to be etched.

In the first main etch step, a mixture comprising HBr and oxygen can be used. If desired, a small amount, e.g., up to about 20 sccm, of a fluorine-containing gas such as $NF_3$, $SF_6$, $SiF_4$, $Si_2F_6$ and the like can be added to the etchant gases. This first main etchant, although anisotropic, deposits a passivation layer on the sidewalls of the opening. Thus this step generally produces a slightly tapered sidewall, such as 85–89° for high aspect ratio deep trenches, and can be 80–89° for shallow trenches. This is advantageous when the trench is to be filled. Since the first main etch step deposits passivation material on the sidewalls and the top of the etched openings, this material can be removed if desired by a wet etch using diluted aqueous HF.

In the second main etch step, a mixture of a fluorine-containing gas, such as $SiF_4$, $Si_2F_6$, $NF_3$ or, preferably, $SF_6$, can be used together with a source of oxygen. This etch is anisotropic and forms very straight, perpendicular sidewalls, having a taper angle of over 88°. Thus using both sequential etch steps, a high etch rate of silicon is achieved, with the desired profile angle control and without erosion of a silicon nitride hardmask. If the trench is to be shaped so that the bottom of the trench is wider than the top of the trench, the ratio of HBr and fluorine-containing gas is adjusted so that the passivation layer is removed with the fluorine-containing gas and etching becomes more isotropic. Both etchants produce trench openings with rounded bottoms. Although a wide ratio of etchant ingredients can be used, a preferred etchant mixture for the second etch step uses a volume ratio of $SF_6$:HBr:$O_2$ of about 1:2:0.85. However, other ratios may be used depending upon the reaction chamber, the reaction conditions used and the shape of the opening desired.

A phenomenon known as "lag effect" occurs during conventional etching, which means it takes longer to etch deeper openings. Using the sequential two step etch process and apparatus of the present invention, this effect is reduced, and the overall etch rate is higher than for prior art processes even for high aspect ratio, small diameter openings.

Figure 4:
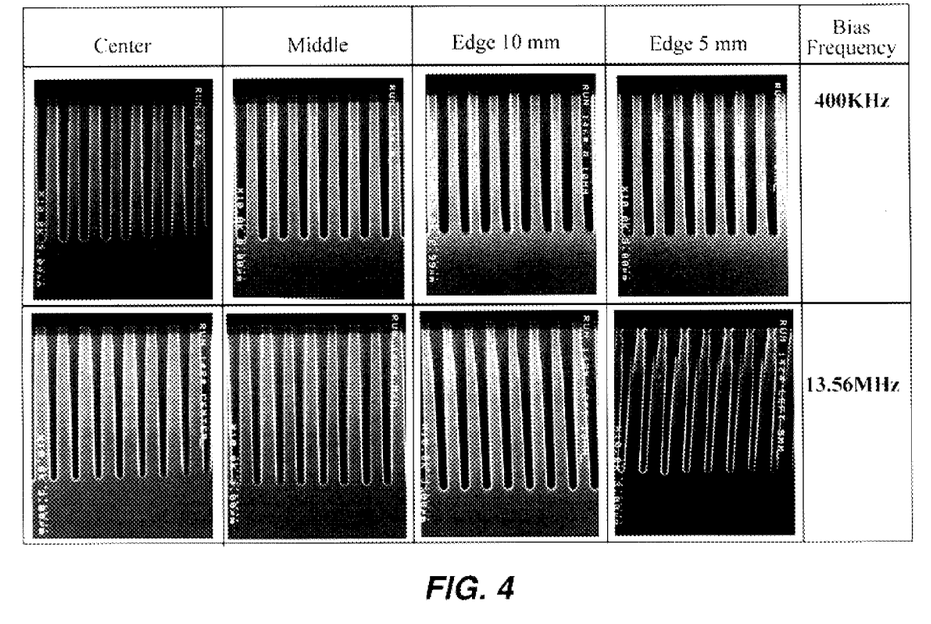
FIG. 4 presents photographs of etched trenches made in accordance with the present invention while varying the bias frequency during etching.

The effect of low bias frequency during the second etch step is shown in FIG. 4. FIG. 4 illustrates a series of openings etched in accordance with the second step process taken at A), the center of the substrate; B) the middle between the center and the edge of the substrate; C) 10 mm from the edge of the substrate and D) 5 mm from the edge of the substrate. The comparison was made using 400 kHz and using 13.56 MHz frequencies supplied to the substrate support. It is apparent that at the lower frequency, there is little change in the sidewall profile across the substrate; whereas at the higher frequency, the sidewall taper is less perpendicular to the silicon surface near the edge of the substrate. Thus in order to obtain etched openings that are more perpendicular to the surface of the substrate, a lower bias frequency should be used.

Figure 5:
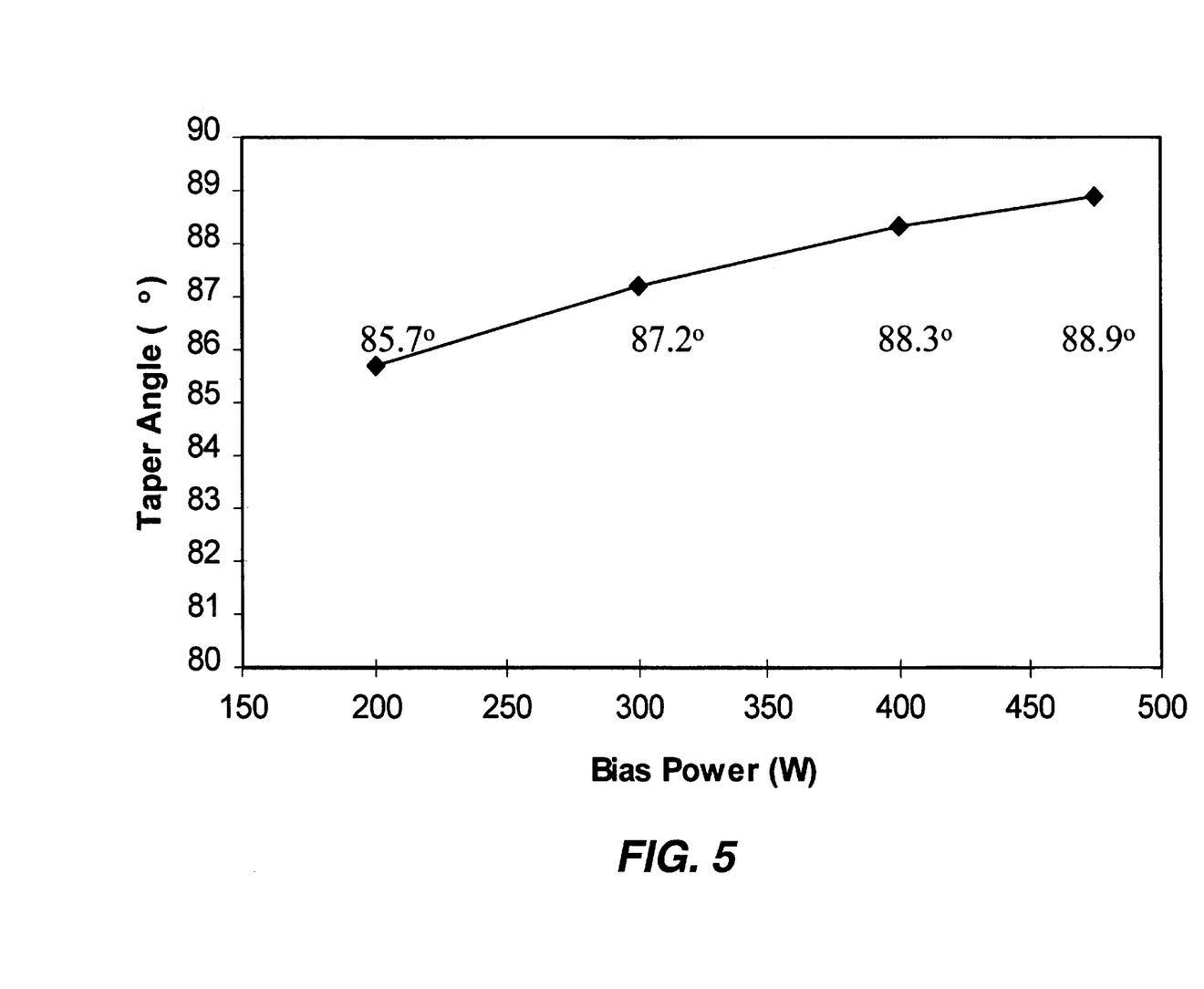
FIG. 5 is a graph of taper angle versus bias power in watts during a first etch step.

The bias power also affects the taper angle during the first etch step. FIG. 5 is a graph of taper angle versus bias power in watts during a first etch step using a pressure of 40 millitorr and a source power of 1600 watts. As the bias power is increased from 200 to 500 watts, the taper angle also increases from 85.7° to 88.9°, which is about vertical. Thus the taper angle for the first etch step can be controlled by varying the bias power.

Figure 6:
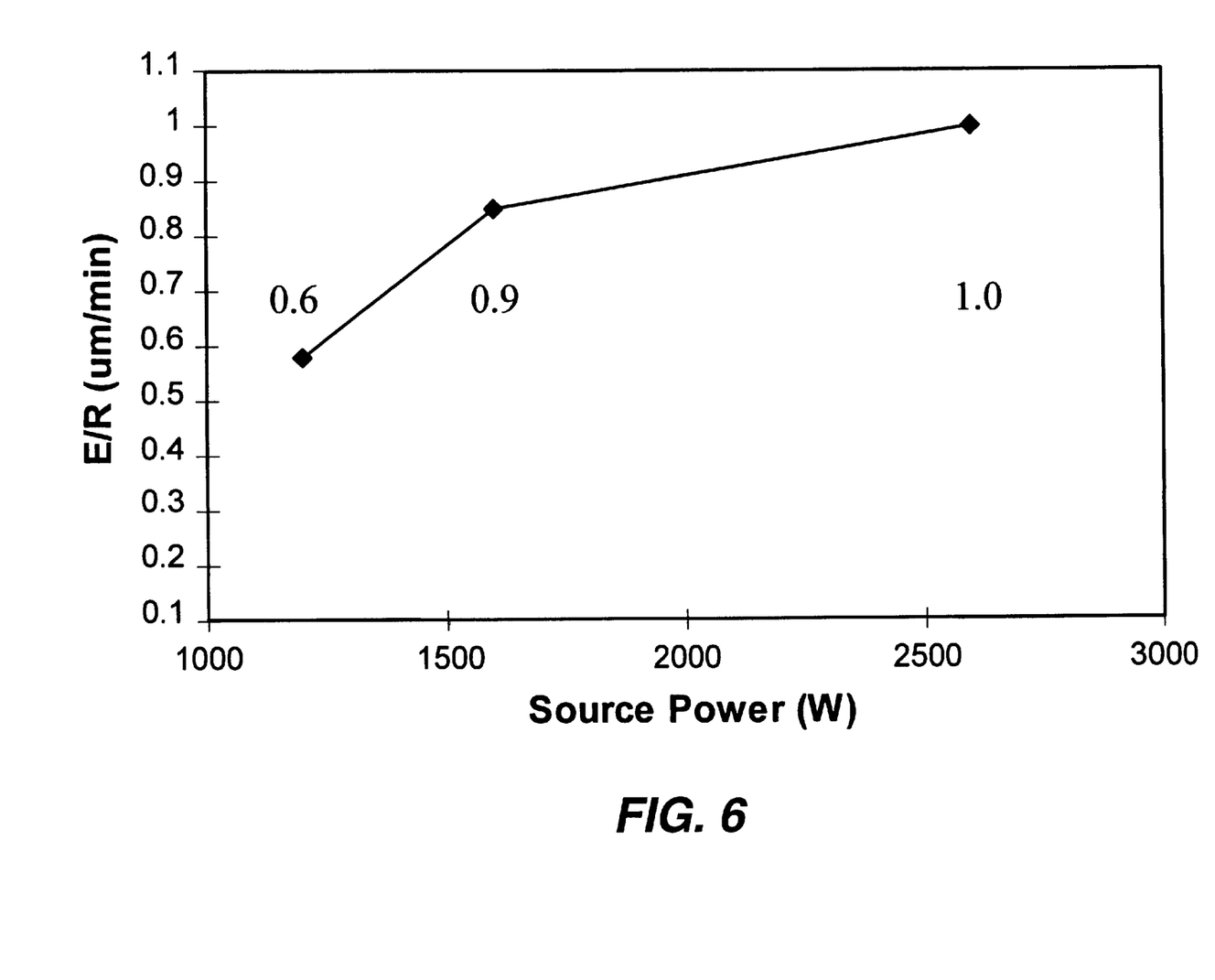
FIG. 6 is a graph of etch rate versus source power during a first etch step.

To control the etch rate during the first etch step, the source power can be varied. FIG. 6 is a graph of etch rate versus source power for the first etch step using a pressure of 40 millitorr and a bias power of 475 watts. As the source power is increased from about 1200 to 2500 watts, the etch rate increases. During the second step etch, if the source power is too low, about 400 watts, the sidewalls of the trenches are rough and the etch rate is low. Excellent results are achieved if the source power is maintained at about 1000 watts during this step.

Figure 7:
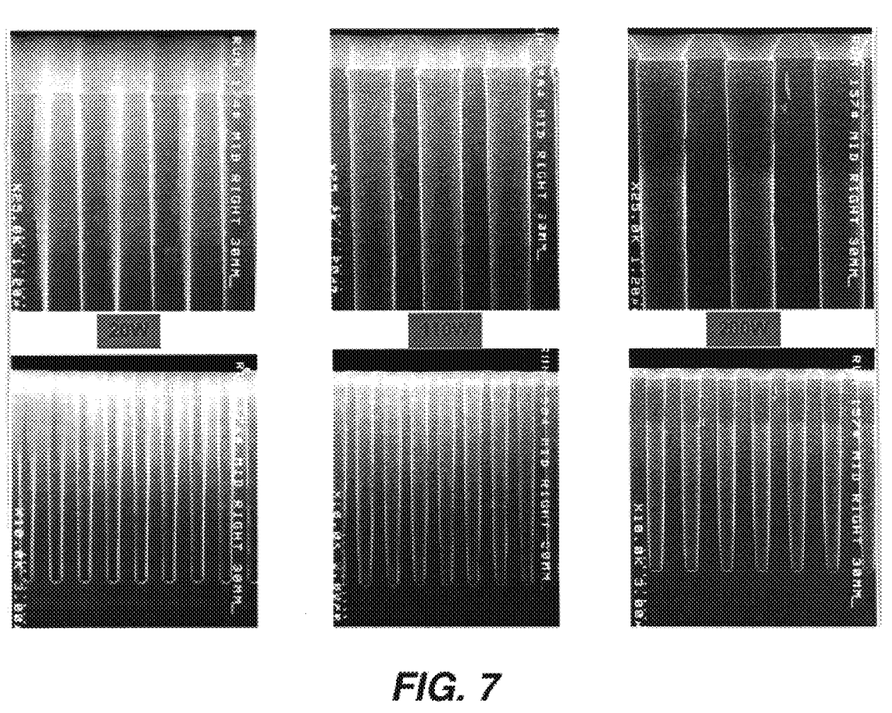
FIG. 7 illustrates variation in taper angle as bias power is increased during a second etch step.

The bias power effect is somewhat different during the second etch step. As the bias power is varied during the second etch step from 20 watts to 200 watts using a pressure of 30 millitorr and a source power of 1000 watts, as illustrated in FIG. 7, the oxide mask etches at a faster rate.

The invention will be further described in the following examples and controls, but the invention is not to be limited by the details described therein.

Control 1

Figure 8:
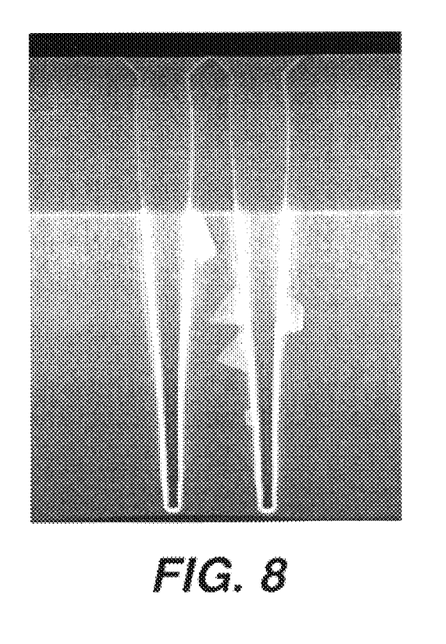
FIG. 8 presents photographs of etched trenches using a first etch step alone.

An etch using a combined hardmask of 7000 Å of silicon oxide and 2200 Å of silicon nitride was etched into silicon using 160 sccm of HBr and 30 sccm of a mixture of oxygen and helium containing about 30% of oxygen (hereinafter $HeO_2$) in an apparatus according to FIG. 2 at a pressure of 40 millitorr. The power to the coil was set at 1600 watts and the power to the substrate support was set at 300 watts. FIG. 8 illustrates the resultant etched trenches which are tapered at the top.

EXAMPLE 1

A two-step etch into silicon was carried out using the apparatus of FIG. 2 under the following conditions:

Step 1: 160 sccm HBr and 33 sccm of $HeO_2$ was passed into the chamber, the pressure was maintained at 40 mTorr, 1600 watts of power was connected to the coil and 300 watts of power was connected to the substrate support. This step was continued for 120 seconds.

Step 2: 55 sccm $SF_6$, 110 sccm HBr and 47 sccm $O_2$ was passed into the chamber, the pressure was maintained at 25 mTorr, 1000 watts of power was connected to the coil and 20 watts of power was connected to the substrate support. This step was continued for 360 seconds.

Figure 9:
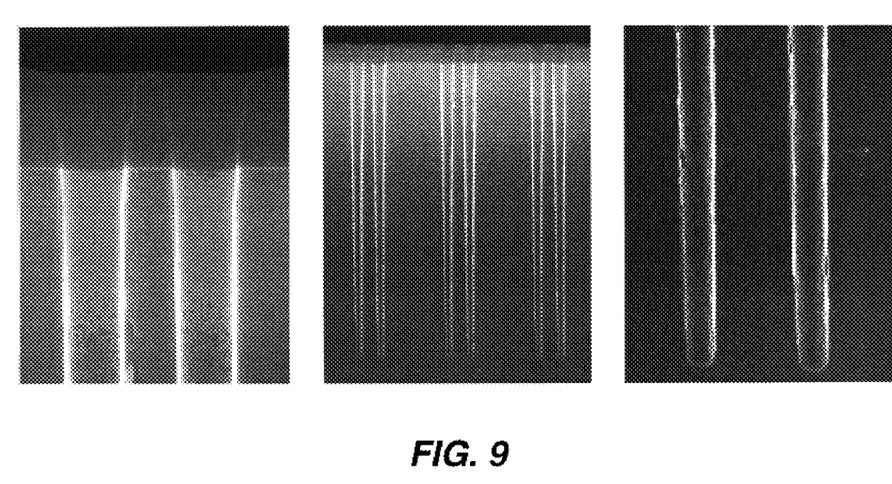
FIG. 9 presents photographs of etched trenches using the method of the present invention.

FIG. 9 is a photograph of the resultant trenches, showing straight walled openings having rounded bottoms. The overall etch rate was 1.0 microns/min. The uniformity across the wafer was about 2.0% between the center and the edge of the wafer, illustrating the excellent control of the present process. The top angle of the openings had a slight taper, 88.4°, but the bottom sidewalls were almost vertical at 89.5°.

EXAMPLE 2

Figure 10:
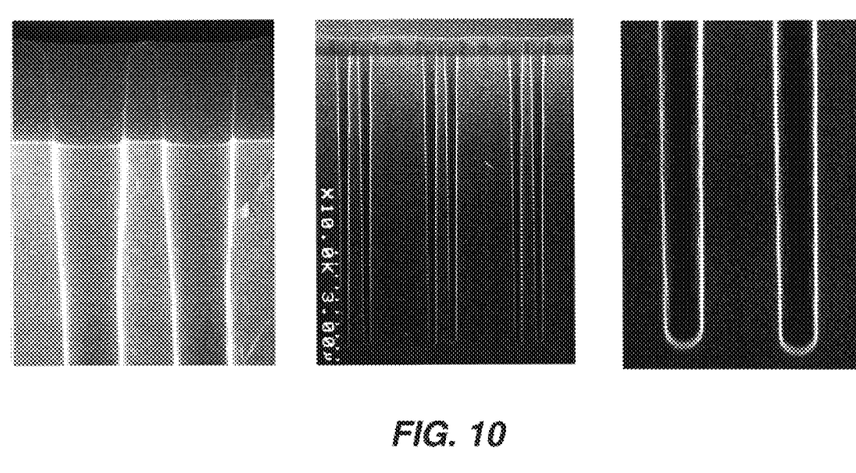
FIG. 10 is a photograph of the trenches of FIG. 8 after a dilute HF dip.

The procedure of Example 1 was followed, except that an aqueous 100:1 water:HF dip was used after step 2 to remove the passivation layer, as shown in FIG. 10.

EXAMPLE 3

This example illustrates that the profile angle can be controlled using the present two step process. The procedure of Example 1 was followed, except that in the second etch step, 800 watts of power was connected to the coil.

Figure 11:
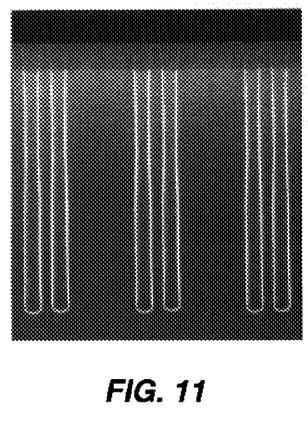
FIGS. 11, 12 and 13 are photographs of trenches made by varying the ratio of HBr during the second etch step.

In Part A, the second etch step etchant used was 45 sccm $SF_6$, 52 sccm HBr and 47 sccm $O_2$. As shown in FIG. 11, the angle at the top of the trench was 89.2° and the angle at the bottom was 90.5°. There is a clear demarcation between the two etchants and the bottom of the trench is tapered outwardly, and is thus wider than the top of the trench.

Figure 12:
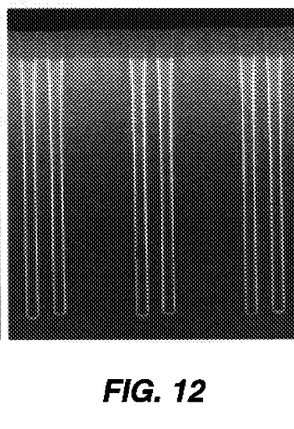

In Part B, the second etch step used 45 sccm $SF_6$, 80 sccm HBr and 47 sccm $O_2$. The top of the trench had an angle of 88.5°, about perpendicular. As shown in FIG. 12, this produced a trench having a slightly tapered opening at the top.

Figure 13:
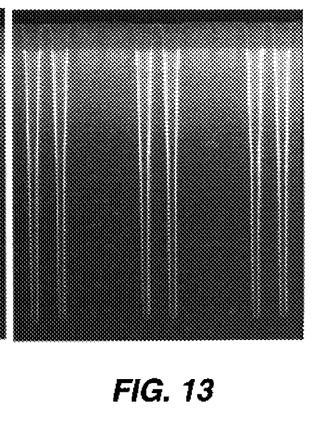

In Part C, the second etch used was 45 sccm $SF_6$, 100 sccm HBr and 47 sccm $O_2$. The top of the trench had an angle of 88.2° and the bottom of the trench had an angle of 89.4°. The resultant trench was tapered at the top, and the bottom of the trench was tapered inwardly, and is thus thinner than the top of the trench. This variation is shown in FIG. 13.

Thus by varying the relative ratio of HBr and $SF_6$, one can control the taper angle of the etched opening.

Figure 14:
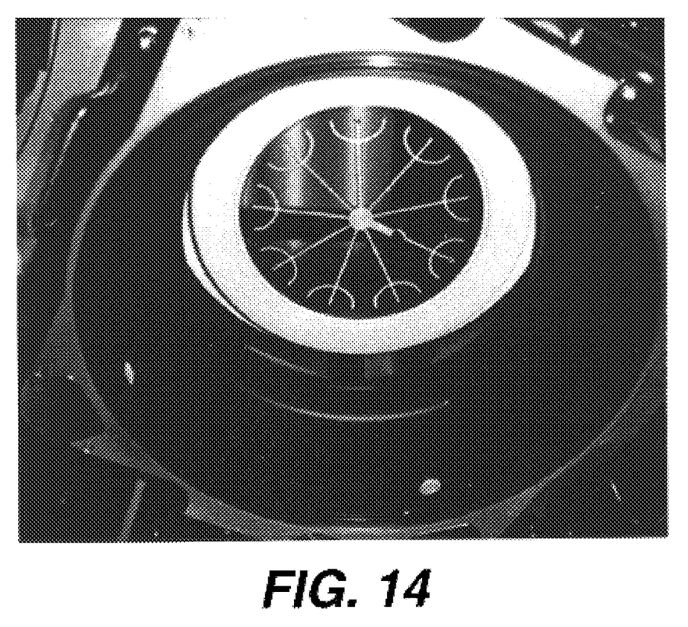
FIGS. 14 and 15 are photographs of the interior and dome respectively of an etch chamber after multiple wafers have been processed sequentially.
Figure 15:
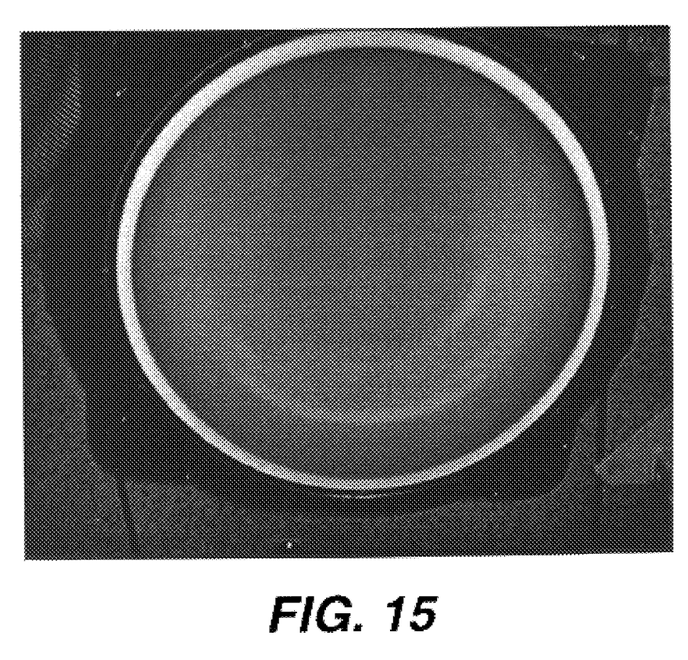

An additional advantage of the present process is that it is very clean. FIG. 14 illustrates the substrate support and FIG. 15 illustrates the interior dome ceiling of the chamber after almost 1000 wafers were sequentially etched in the chamber using an oxide hardmask. It is apparent that no visible deposits or particles are to be seen, and that thus many wafers can be sequentially processed in accordance with the present invention without the need for a cleaning step.

Using the present two-step process, the etch rate uniformity across a wafer is less than 5%; the etch rate is over 1 micron/min; and the selectivity of silicon to an oxide mask is high; e.g., less than 4000 Å loss of oxide during an 7 micron deep etch into silicon.

Although the present etch process has been described in terms of particular embodiments of etch reactants and conditions, one skilled in the art will recognize that variations can be made to power, pressure, ratio of etchant ingredients and the like. Such variations are meant to be included herein. Thus the invention is only to be limited by the scope of the appended claims.

We claim:

1. A method of etching deep, high aspect ratio openings having rounded bottoms in silicon using a silicon oxide hardmask in a plasma vacuum chamber having a first source of RF power connected to the chamber and a second source of RF power connected to a support for the substrate comprising the following two steps in sequence:
   a) etching using a mixture including HBr and oxygen which deposits a passivation layer on the sidewalls to form slightly tapered openings, and
   b) etching using a mixture of a fluorine-containing gas, HBr and oxygen to form high aspect ratio openings.

2. A method according to claim 1 step b) wherein the fluorine-containing gas is selected from the group consisting of $SF_6$ $SiF_4$, $Si_2F_6$ and $NF_3$.

3. A method according to claim 2 wherein the fluorine-containing gas is $SF_6$.

4. A method according to claim 3 wherein the volume ratio of HBr:$SF_6$ is from 0.1 to 10.

5. A method according to claim 3 wherein the volume ratio of HBr and $SF_6$:oxygen is from 0.1 to 10.

6. A method according to claim 1 wherein oxygen is added in step a) as a mixture in helium including up to about 30 percent by volume of oxygen.

7. A method according to claim 6 wherein from about 10 to about 50 percent by volume of the helium-oxygen mixture is added based on the hydrogen bromide added.

8. A method according to claim 1 wherein a fluorine-containing gas is added during step a) to remove the passivation layer on the bottom of the trench.

9. A method according to claim 8 wherein the fluorine-containing gas is selected from the group consisting of $SF_6$, $SiF_4$, $Si_2F_6$ and $NF_3$.

10. A method according to claim 1 wherein step a) is carried out at a pressure of from about 1 to 150 millitorr.

11. A method according to claim 10 wherein at least about 500 watts of power is connected to the chamber.

12. A method according to claim 11 wherein up to about 3000 watts of power is connected to the chamber.

13. A method according to claim 12 wherein from about 20 to 2000 watts of power is connected to the substrate support.

14. A method according to claim 1 wherein step b) is carried out at a pressure of from about 1 to 100 millitorr.

15. A method according to claim 14 wherein from about 400 to 2000 watts of power is connected to the chamber.

16. A method according to claim 15 wherein from about 1 to 500 watts is connected to the substrate support.

17. A method of controlling the profile of a high aspect ratio trench in silicon comprising the following steps in sequence:
   a) etching through a hardmask using a mixture of hydrogen bromide and oxygen to form a passivation layer over the formed opening; and
   b) etching using a mixture of a fluorine-containing gas, hydrogen bromide and oxygen and varying the angle of taper of the etched sidewalls by adjusting the percentages of the gas mixture.

18. A method according to claim 17 wherein the fluorine-containing gas is selected from the group consisting of $SF_6$, $SiF_4$, $Si_2F_6$ and $NF_3$.

19. A method according to claim 18 wherein the fluorine-containing gas is $SF_6$.

20. A method according to claim 17 wherein a fluorine-containing gas is added during step a) to remove passivation material at the bottom of the trench.

21. A method of continuously etching high aspect ratio openings in silicon in a single processing chamber comprising the following steps in sequence:
   a) supplying a silicon substrate to an etch chamber;
   b) carrying out a first etch step in the chamber using an etchant composition of HBr and oxygen;
   c) carrying out a second etch step in the chamber using an etchant composition of HBr, oxygen and a fluorine-containing gas;
   d) removing the substrate from the chamber; and
   e) supplying a second silicon substrate to the chamber and sequentially carrying out steps b), c) and d).

22. A method according to claim 21 wherein the fluorine-containing gas is selected from the group consisting of $SiF_6$, $SiF_4$, $Si_2F_6$ and $NF_3$.

23. A method according to claim 22 wherein the fluorine-containing gas is $SiF_6$.

* * * * *